United States Patent [19]
Lee et al.

[11] Patent Number: 5,946,599
[45] Date of Patent: Aug. 31, 1999

[54] METHOD OF MANUFACTURING A SEMICONDUCTOR IC DEVICE

[75] Inventors: Hsiang-Fan Lee, Hsin-Chu; Buh Fang Chen, Taipe; Ming-Hsung Chang, Hsin-Chu, all of Taiwan

[73] Assignee: Taiwan Semiconductor Manufacturing Company, Ltd., Hsin-Chu, Taiwan

[21] Appl. No.: 08/899,668

[22] Filed: Jul. 24, 1997

[51] Int. Cl.⁶ .................................................. H01L 21/44
[52] U.S. Cl. ............................................ 438/683; 438/660
[58] Field of Search .................................. 438/305, 453, 438/585, 594, 658, 660, 592, 655, 657, 664, 683

[56] References Cited

U.S. PATENT DOCUMENTS

| | | | |
|---|---|---|---|
| 5,147,820 | 9/1992 | Chittipeddi et al. | 438/590 |
| 5,306,951 | 4/1994 | Lee et al. | 257/755 |
| 5,364,803 | 11/1994 | Lur et al. | 437/40 |
| 5,382,832 | 1/1995 | Buti et al. | 257/773 |
| 5,422,311 | 6/1995 | Woo | 437/193 |
| 5,459,087 | 10/1995 | Mochizuki | 437/39 |
| 5,510,296 | 4/1996 | Yen et al. | 437/200 |
| 5,585,296 | 12/1996 | Wu | 437/44 |
| 5,654,242 | 8/1997 | Komatsu | 438/585 |
| 5,756,392 | 5/1998 | Lu et al. | 438/592 |
| 5,767,004 | 6/1998 | Balasubramanian et al. | 438/592 |
| 5,771,110 | 6/1998 | Hirano et al. | 257/72 |

*Primary Examiner*—Chandra Chaudhari
*Assistant Examiner*—Reneé R. Berry
*Attorney, Agent, or Firm*—George O. Saile; Stephen B. Ackerman

[57] ABSTRACT

An improved and new method for the formation of polycide used for the gate electrode or interconnect metallization in integrated circuit devices has been developed. Annealing of the polycide structure in nitrogen prior to subsequently depositing a layer of oxide by LPCVD processing using $SiH_2Cl_2$ and $N_2O$ prevents deleterious interaction of the patterned polycide structure with the deposited oxide layer and results in a highly manufacturable process having high yield.

4 Claims, 2 Drawing Sheets

METHOD OF MANUFACTURING A SEMICONDUCTOR IC DEVICE

RELATED PATENT APPLICATION

Ser. No. 08/787,194, filed Jan. 22, 1997 entitled IMPROVED METHOD OF FORMATION OF POLYCIDE IN A SEMICONDUCTOR IC DEVICE, Docket No. TSMC96-132.

BACKGROUND OF THE INVENTION (1) Field of the Invention

This invention relates to a method of fabrication used for semiconductor integrated circuit devices, and more specifically to an improved process for the formation of polycide used for the gate electrode or interconnect metallization in integrated circuit devices.

(2) Description of Related Art

In the manufacture of semiconductor devices, the formation of conductive lines, such as the gate electrode in a MOSFET device or interconnections between IC devices, is a critical step in producing functioning and reliable circuits. Polycrystalline silicon is a material which is commonly used to form such gate electrodes and interconnections. In order to increase the conductivity of these gate electrodes and interconnection lines, a refractory silicide, such as tantalum silicide, is deposited on top of the polysilicon. Such a structure is referred to as polycide.

Numerous improvements to the polycide deposition process have been invented. For example, U.S. Pat. No. 5,510,296 entitled "Manufacturable Process For Tungsten Polycide Contacts Using Amorphous Silicon" granted Apr. 23, 1996 to Haw Yen et al describes a method of tungsten polycide formation in which amorphous silicon is deposited by LPCVD processing, followed by deposition of tungsten silicide by LPCVD processing using $SiH_4$ and $WF_6$, and annealing the structure in nitrogen at a temperature between about 750° and 850° C. for a time between about 30 and 60 minutes.

Also, U.S. Pat. No. 5,459,087 entitled "Method of Fabricating a Multi-layer Gate Electrode With Annealing Step" granted Oct. 17, 1995 to Akira Mochizuki describes a method of forming a gate electrode including a tungsten silicide layer. The method performs a nitrogen anneal of a tungsten layer prior to sputtering a tungsten silicide layer.

U.S. Pat. No. 5,364,803 entitled "Method of Preventing Fluorine-Induced Gate Oxide Degradation in $Wsi_x$ Polycide Structure" granted Nov. 15, 1994 to Water Lur et al describes a method of tungsten polycide formation in which polysilicon is deposited, followed by deposition of a thin diffusion barrier layer consisting of tantalum nitride, then depositing tungsten silicide, and annealing the structure in nitrogen and oxygen at a temperature between about 800 and 1050° C. for a time between about 10 and 60 minutes.

U.S. Pat. No. 5,306,951 entitled "Sidewall Silicidation For Improved Reliability and Conductivity" granted Apr. 26, 1994 to Roger R. Lee et al describes a structure for formation of a refractory silicide by depositing the refractory metal by sputtering on the sidewalls as well as the top of a polysilicon structure, thereby resulting in a more conductive structure.

While these inventions result in improvements to the polycide deposition process they do not address critical IC device manufacturability issues, such as interaction of previous and subsequent processing steps, overall process yield, device reliability, and cost.

The present invention is directed to a novel and improved process for the formation of polycide used for the gate electrode or interconnect metallization in integrated circuit devices, wherein manufacturability, manufacture process yield, and device reliability are improved.

SUMMARY OF THE INVENTION

One object of the present invention is to provide an improved method of fabricating polycide used for the gate electrode or interconnect metallization in integrated circuit devices.

Another object of the present invention is to provide a new and improved process for fabricating polycide used for the gate electrode or interconnect metallization in integrated circuit devices, wherein subsequent process steps do not degrade the integrity of the polycide.

A further object of the present invention is to provide a new and improved process for fabricating polycide used for the gate electrode or interconnect metallization in integrated circuit devices, wherein subsequent deposition of oxide by CVD (Chemical Vapor Depostion), LPCVD (Low Pressure Chemical Vapor Deposition), or PECVD (Plasma Enhanced Chemical Vapor Deposition), does not degrade the integrity of the polycide.

In accordance with the present invention, the above and other objectives are realized by using a method of fabrication of a tungsten polycide interconnection structure over an oxide layer in an integrated circuit comprising the steps of: providing the oxide layer on the surface of a semiconductor substrate; depositing a layer of doped amorphous silicon using LPCVD processing of silane ($SiH_4$) and $PH_3$, at a temperature between about 560 and 580° C., to a thickness between about 900 and 1100 Angstroms; depositing a tungsten silicide layer on the layer of doped amorphous silicon to form tungsten polycide, using LPCVD processing of dichlorosilane ($SiH_2Cl_2$) and $WF_6$, at a temperature between about 540 and 560° C., to a thickness between about 1200 and 1300 Angstroms; patterning of the tungsten polycide to form the tungsten polycide interconnection structure; and annealing the tungsten polycide interconnection structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
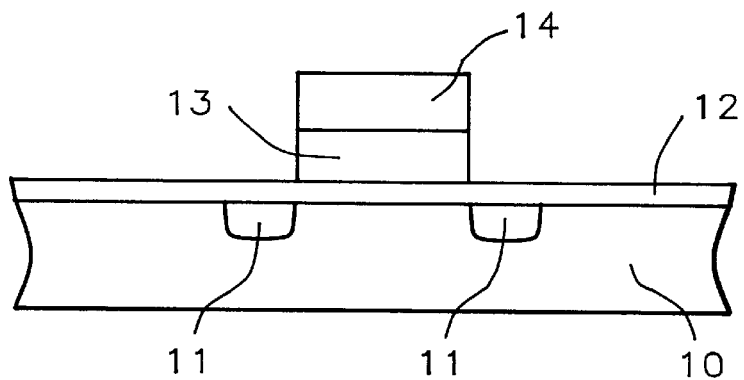
FIG. 1, which schematically, in cross-sectional representation, illustrates the preferred embodiment of the present invention.

The new and improved method of forming polycide used for the gate electrode or interconnect metallization in integrated circuit devices will now be described in detail. The polycide gate electrode or interconnect metallization can be used, for example, in MOSFET devices that are currently being manufactured in industry; therefore only the specific areas unique to understanding this invention will be described in detail.

A key objective of this invention is to have a manufacturable process for fabricating polycide gate electrodes or interconnect metallization lines. The manufacturable process must produce high process yield and reliable devices. It is important that the polycide formation process result in reliable step coverage by the polycide over the topography of the semiconductor circuit device. Furthermore, the polycide formation process must not degrade the performance of the MOSFET device. For example, during processing to form the polycide gate electrode there should not be an increase in the thickness of the gate oxide. The process must, also, produce polycide gate electrodes or interconnect metallization lines which are not degraded during subsequent device manufacturing process steps. For example, manufacturing process steps, such as dielectric layer deposition, performed subsequently to polycide gate electrode or interconnect metallization formation should not degrade the integrity of the polycide gate electrode or interconnect metallization. Therefore, in selecting a manufacturable process for polycide used for the gate electrode or interconnection metallization in semiconductor circuit devices it is important to ascertain the effects of the polycide formation process on the device and, also, the effects of subsequent process steps on the integrity of the polycide.

In general, the formation of polycide is accomplished by first depositing a layer of doped amorphous silicon by LPCVD, (Low Pressure Chemical Vapor Deposition), using $SiH_4$, $SiH_2Cl_2$, $SiHCl_3$, or $SiCl_4$ and $PH_3$. Then a layer of a refractory silicide, such as tungsten silicide, is deposited by LPCVD processing using $SiH_4$ and $WF_6$ or $SiH_2Cl_2$ and $WF_6$. Heat treatment, either in situ during tungsten silicide deposition, or subsequent to the tungsten silicide deposition, results in formation of the polycide. These are known processes in the semiconductor industry, but taken individually they do not address the overall manufacturability of an IC device. In order to assess the manufacturability of a process one has to ascertain the interaction of previous and subsequent process steps. For example, we have found that deposition of the doped amorphous silicon from $SiH_4$ and $PH_3$ is preferable because this is a highly reliable process, yielding high quality, defect-free doped amorphous films having good step coverage. The deposition process is well understood and is highly manufacturable. Also, deposition of the tungsten silicide layer from $SiH_2Cl_2$ and $WF_6$ is preferable to deposition from $SiH_4$ and $WF_6$ because of several manufacturing and process result issues. Firstly, film nucleation is more easily controlled, resulting in a tungsten silicide layer having: a) no tungsten enrichment at the interface with the doped amorphous silicon, b) no consumption of the doped amorphous silicon, and c) no delamination at the interface. Secondly, tungsten silicide deposited from $SiH_2Cl_2$ and $WF_6$ has low fluorine content and good step coverage over surface topography. Also, the deposition process results in a tungsten silicide layer having low mechanical stress, not subject to delamination after deposition.

On the other hand, if the polycide is formed from a tungsten silicide layer deposited from $SiH_2Cl_2$ and $WF_6$ onto a doped amorphous silicon layer, there is a deleterious interaction of the patterned polycide structure with an oxide layer subsequently deposited by LPCVD processing using $SiH_2Cl_2$ and $N_2O$. During the deposition of the oxide layer abnormal and irregular oxide growth appears on the sidewalls and top surface of the patterned polycide. Conformality of the oxide layer over the polycide structure is not achieved, as desired, and the integrity of the polycide structure is jeopardized. Manufacturing process yield is decreased and device reliability is degraded.

The object of the present invention is to provide a new and improved process for fabricating polycide used for the gate electrode or interconnect metallization in integrated circuit devices, wherein subsequent deposition of oxide by CVD (Chemical Vapor Deposition), LPCVD (Low Pressure Chemical Vapor Deposition), or PECVD (Plasma Enhanced Chemical Vapor Deposition), does not degrade the integrity of the polycide.

Referring to FIG. 1, there is illustrated in cross-sectional representation a portion of a partially complete integrated circuit. Semiconductor substrate, 10, is preferably composed of monocrystalline silicon. Source and drain regions, 11, are formed as is understood in the art either before or after formation of the gate structure. Gate silicon oxide layer, 12, is deposited over the surface of the substrate, 10. Typically, the gate oxide thickness is between about 75 to 95 Angstroms. Next, the gate doped amorphous silicon layer, 13, is deposited over the gate oxide using LPCVD processing of $SiH_4$ and $PH_3$, at a temperature between about 560 and 580° C., to a thickness between about 900 and 1100 Angstroms. A layer of tungsten silicide, 14, is deposited by LPCVD processing of dichlorosilane ($SiH_2Cl_2$) and $WF_6$, at a temperature between about 540 and 560° C., to a thickness between about 1200 and 1300 Angstroms. Using conventional photolithography and RIE (Reactive Ion Etching) techniques, the layers, 13 and 14, are patterned to form the desired polycide gate electrodes. Following patterning the polycide gate electrodes are annealed in a nitrogen ambient at a temperature between about 800 to 950° C., and preferably 850° C., for a time between about 3 to 5 min. The anneal step is performed using a nitrogen flow between about 10 to 20 standard liters per minute.

Figure 2:
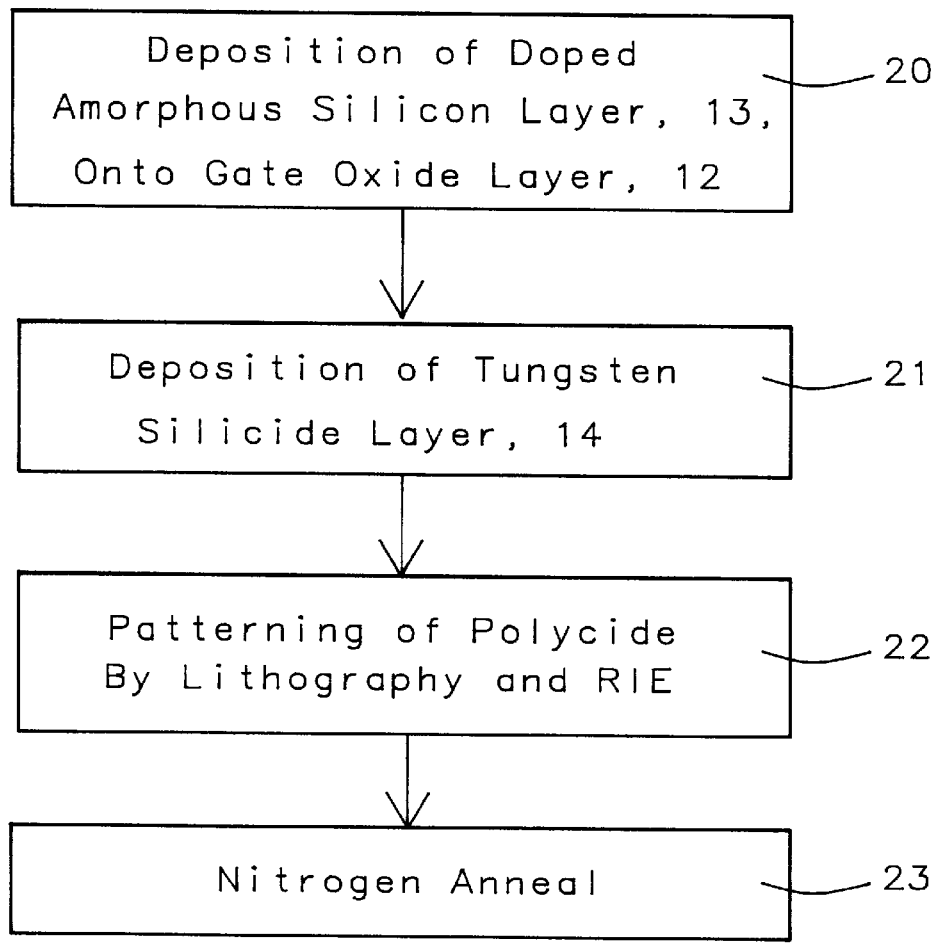
FIG. 2, which is a flow chart of the method of the preferred embodiment of the present invention illustrated in FIG. 1.

FIG. 2 is a flow chart of the method of the preferred embodiment of the present invention illustrated in FIG. 1. Step 20 deposits a doped amorphous silicon layer onto a gate oxide layer. Step 21 deposits a tungsten silicide layer onto the doped amorphous silicon layer to form polycide. Step 22 patterns the polycide by lithography and RIE. Step 23 anneals the patterned polycide in nitrogen.

In this preferred embodiment of the present invention, as illustrated in FIGS. 1 and 2, the critical element of the invention is the nitrogen anneal of the polycide structure. The nitrogen anneal prevents the deleterious interaction of the patterned polycide structure with an oxide layer subsequently deposited by LPCVD processing using $SiH_2Cl_2$ and $N_2O$.

Figure 3:
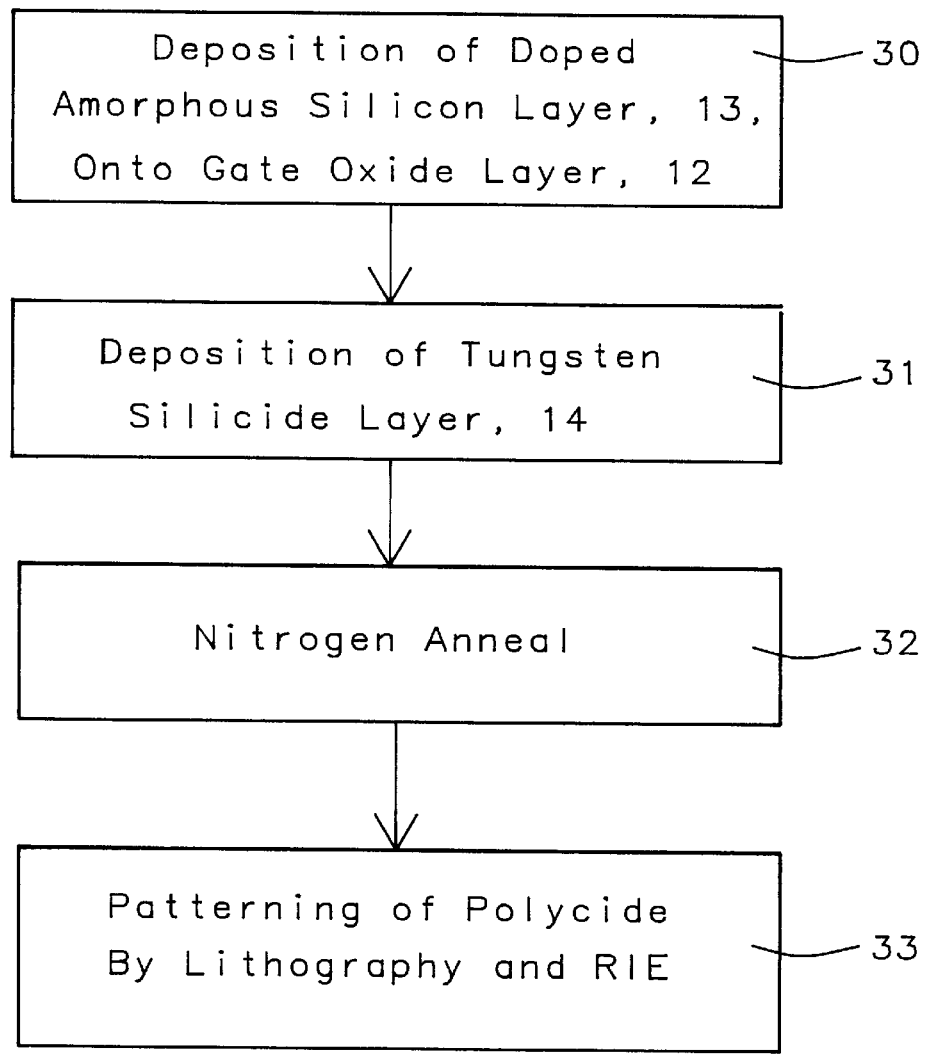
FIG. 3, which is a flow chart of the method of a second embodiment of the invention.

Alternately, the nitrogen anneal step can be performed prior to patterning of the polycide layer, as is shown in FIG. 3, which is a flow chart of this second embodiment of the invention. Step 30 deposits a doped amorphous silicon layer onto a gate oxide layer. Step 31 deposits a tungsten silicide layer onto the doped amorphous silicon layer to form polycide. Step 32 anneals the polycide in nitrogen. Step 33 patterns the annealed polycide by lithography and RIE.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a tungsten polycide interconnection structure over an oxide layer in an integrated circuit comprising the steps of:

providing said oxide layer on the surface of a semiconductor substrate;

depositing a layer of doped amorphous silicon using LPCVD processing of $SiH_4$ and $PH_3$, at a temperature between about 560 to 580° C., to a thickness between about 900 to 1100 Angstroms;

depositing a tungsten silicide layer on said layer of doped amorphous silicon to form tungsten polycide, using LPCVD processing of dichlorosilane ($SiH_2Cl_2$) and $WF_6$, at a temperature between about 540 to 560° C., to a thickness between about 1200 to 1300 Angstroms;

patterning of said tungsten polycide to form the tungsten polycide interconnection structure; and annealing of said tungsten polycide interconnection structure in nitrogen, at a temperature between about 800 to 950° C., for a time between about 3 to 5 min.

2. The method of claim 1, wherein the patterning of said tungsten polycide is by RIE processes.

3. A method of fabrication of a tungsten polycide interconnection structure over an oxide layer in an integrated circuit comprising the steps of:

providing said oxide layer on the surface of a semiconductor substrate;

depositing a layer of doped amorphous silicon using LPCVD processing of $SiH_4$ and $PH_3$, at a temperature between about 560 to 580° C., to a thickness between about 900 to 1100 Angstroms;

depositing a tungsten silicide layer on said layer of doped amorphous silicon to form tungsten polycide, using LPCVD processing of dichlorosilane ($SiH_2Cl_2$) and $WF_6$, at a temperature between about 540 to 560° C., to a thickness between about 1200 to 1300 Angstroms;

annealing said tungsten polycide in nitrogen, at a temperature between about 800 to 950° C., for a time between about 3 to 5 min; and patterning of said tungsten polycide to form said tungsten polycide interconnection structure.

4. The method of claim 3, wherein the patterning of said tungsten polycide is by RIE processes.

* * * * *